(12) United States Patent
Van Der Mee et al.

(10) Patent No.: US 8,295,055 B2
(45) Date of Patent: Oct. 23, 2012

(54) LOCKING ASSEMBLY FOR LOCKING AN ELECTRONICS CARD TO A RACK

(75) Inventors: Marnix Van Der Mee, Montlouis sur Loire (FR); Renaud Alexandre, Montreuil en Touraine (FR); Patrice Becavin, Villefontaine (FR)

(73) Assignee: Radiall, Rosny Sous Bois (FR)

( * ) Notice: Subject to any disclaimer, the term of this patent is extended or adjusted under 35 U.S.C. 154(b) by 245 days.

(21) Appl. No.: 12/757,603

(22) Filed: Apr. 9, 2010

(65) Prior Publication Data

US 2010/0265679 A1 Oct. 21, 2010

(30) Foreign Application Priority Data

Apr. 15, 2009 (FR) ...................................... 09 52459

(51) Int. Cl.
*H05K 5/00* (2006.01)
(52) U.S. Cl. .......................... 361/759; 361/727; 361/756
(58) Field of Classification Search .......... 361/727–730, 361/752, 756, 759, 790, 796–797, 800–803
See application file for complete search history.

(56) References Cited

U.S. PATENT DOCUMENTS

| | | | |
|---|---|---|---|
| 4,564,250 A * | 1/1986 | Klein et al. | ................... 439/108 |
| 4,583,808 A | 4/1986 | Porter et al. | |
| 5,388,995 A * | 2/1995 | Rudy et al. | ..................... 439/61 |
| 5,629,836 A * | 5/1997 | Wright | ........................ 361/755 |
| 5,675,475 A | 10/1997 | Mazura et al. | |
| 5,815,377 A * | 9/1998 | Lund et al. | .................... 361/802 |
| 6,266,248 B1* | 7/2001 | Hanas et al. | ................... 361/752 |
| 7,079,381 B2* | 7/2006 | Brehm et al. | ............ 361/679.33 |
| 2002/0012237 A1 | 1/2002 | Dimarco | |
| 2002/0090581 A1 | 7/2002 | Twist et al. | |
| 2005/0117316 A1 | 6/2005 | Wrycraft | |

FOREIGN PATENT DOCUMENTS

| | | |
|---|---|---|
| AU | 417586 | 10/1969 |
| FR | 2 733 658 A1 | 10/1996 |

OTHER PUBLICATIONS

French Search Report issued Nov. 18, 2009 in corresponding French Patent Application No. 09 52459 (with translation).

* cited by examiner

*Primary Examiner* — Hung S Bui
(74) *Attorney, Agent, or Firm* — Oliff & Berridge, PLC

(57) ABSTRACT

A locking assembly for locking at least one electronics card to a rack, the assembly comprising:
  at least one electronics card;
  a rack having a bottom plate with at least one housing; and
  a locking system for locking the card on the rack;
  the locking system including at least one resilient prestress element for prestressing the electronics card when it is fastened to the rack.

10 Claims, 8 Drawing Sheets

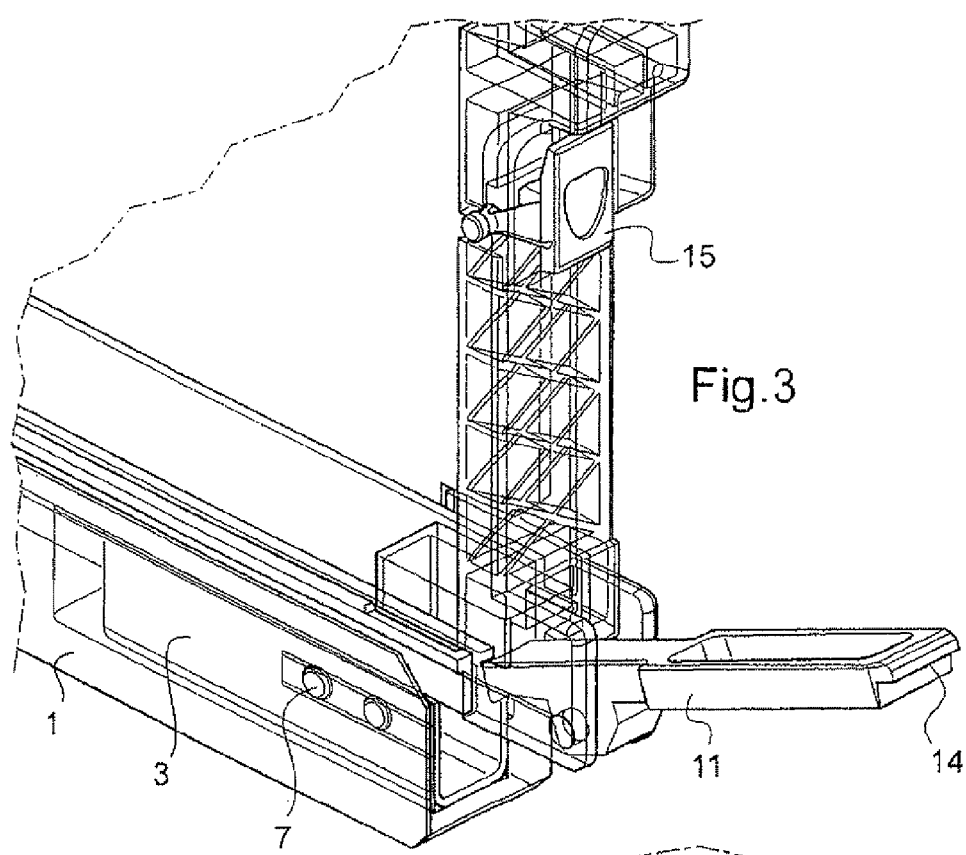
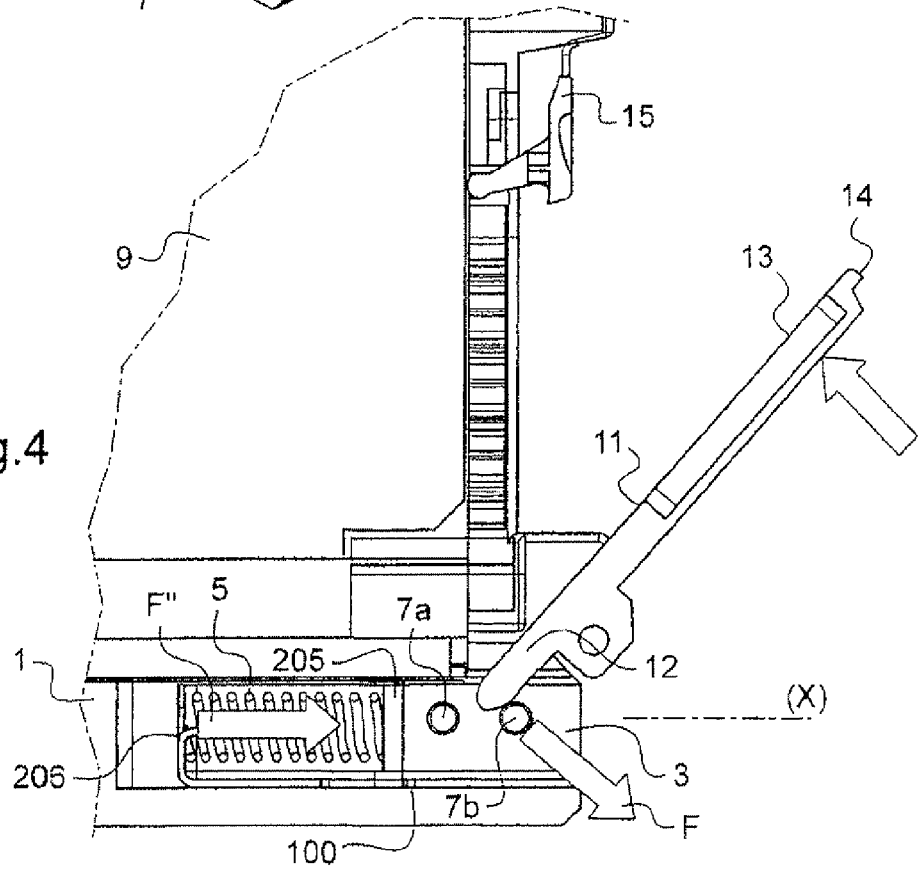

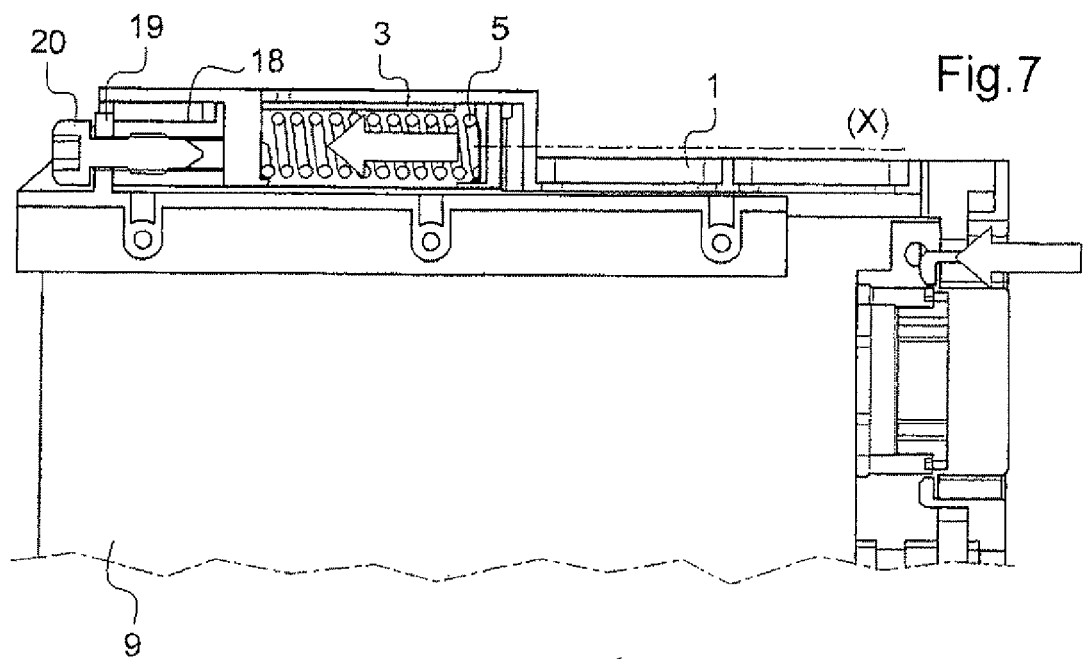
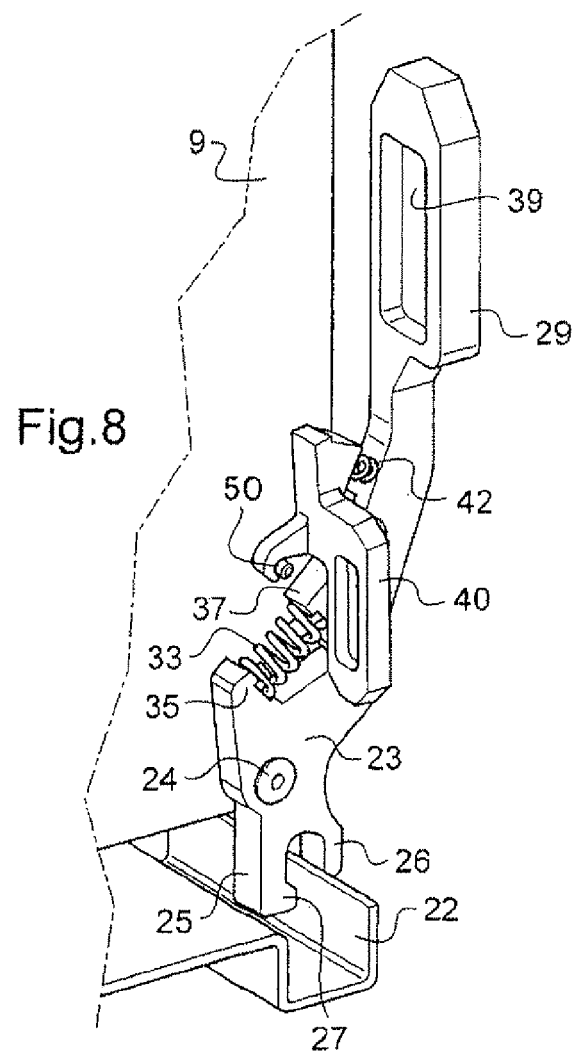

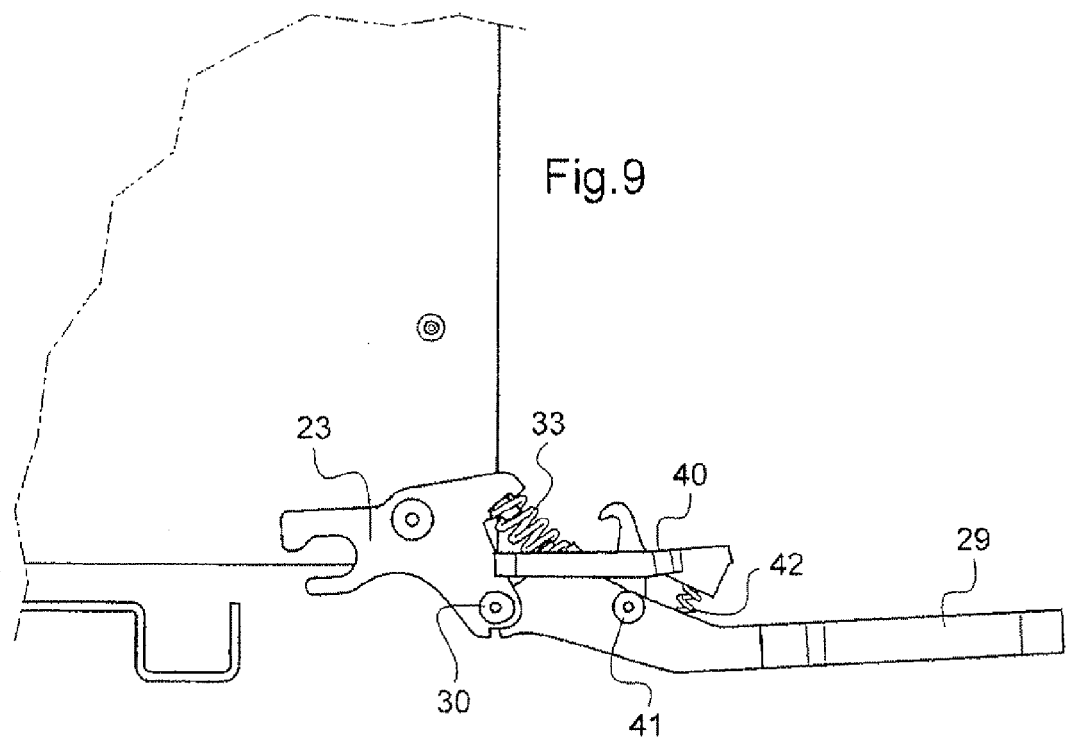
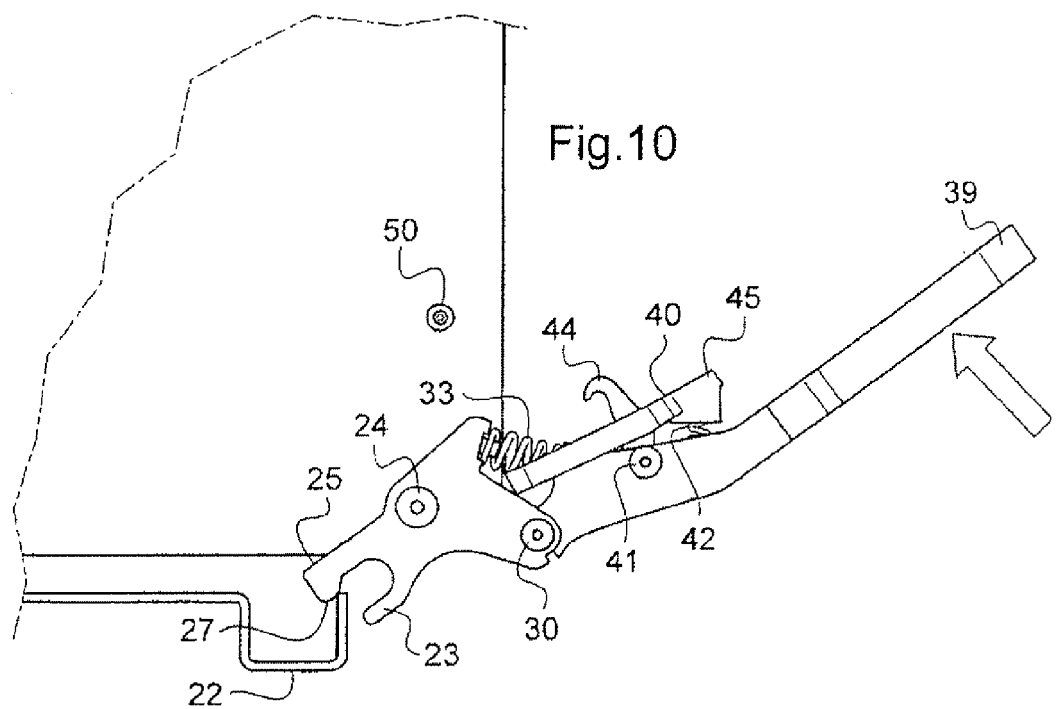

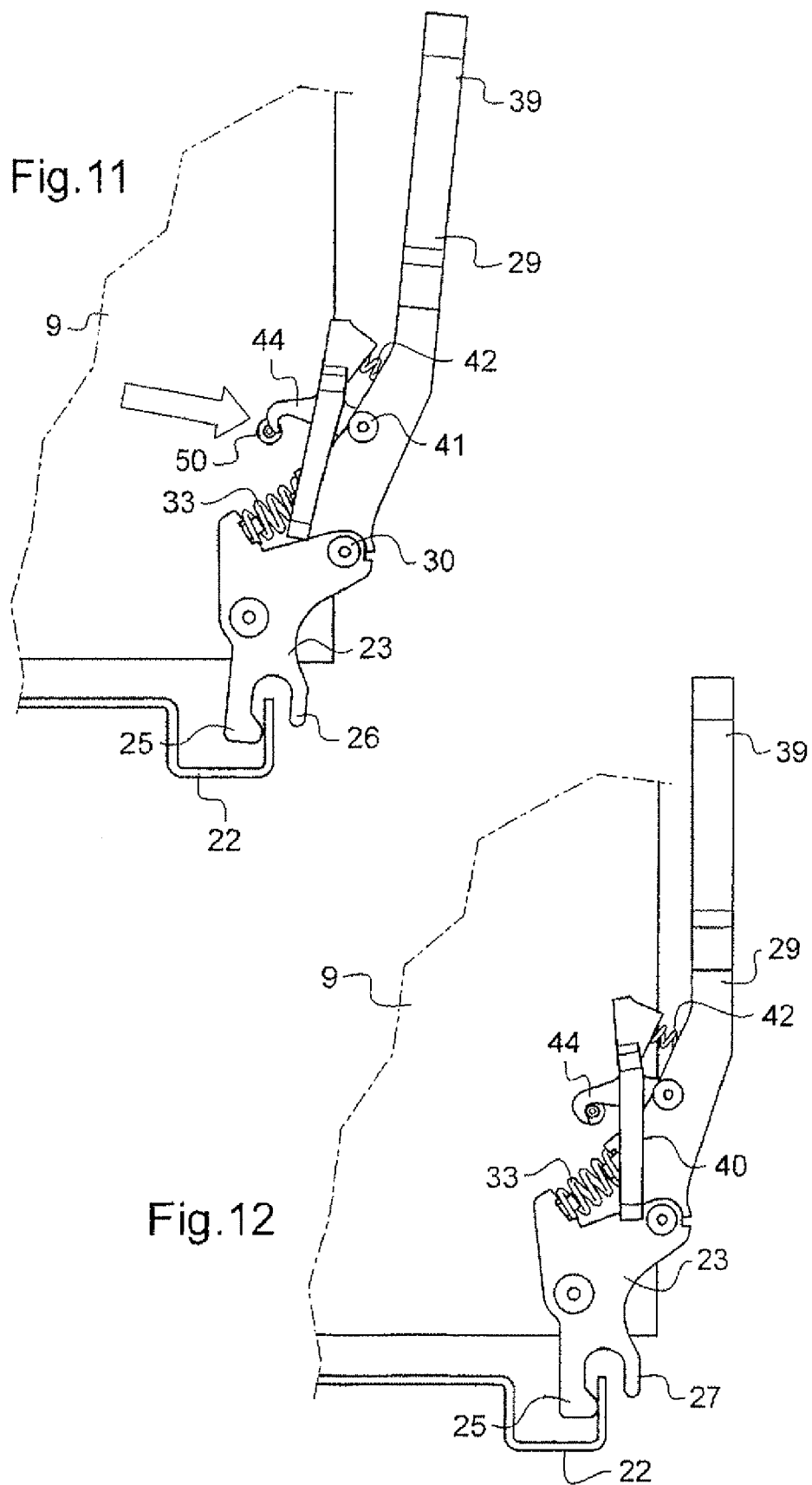

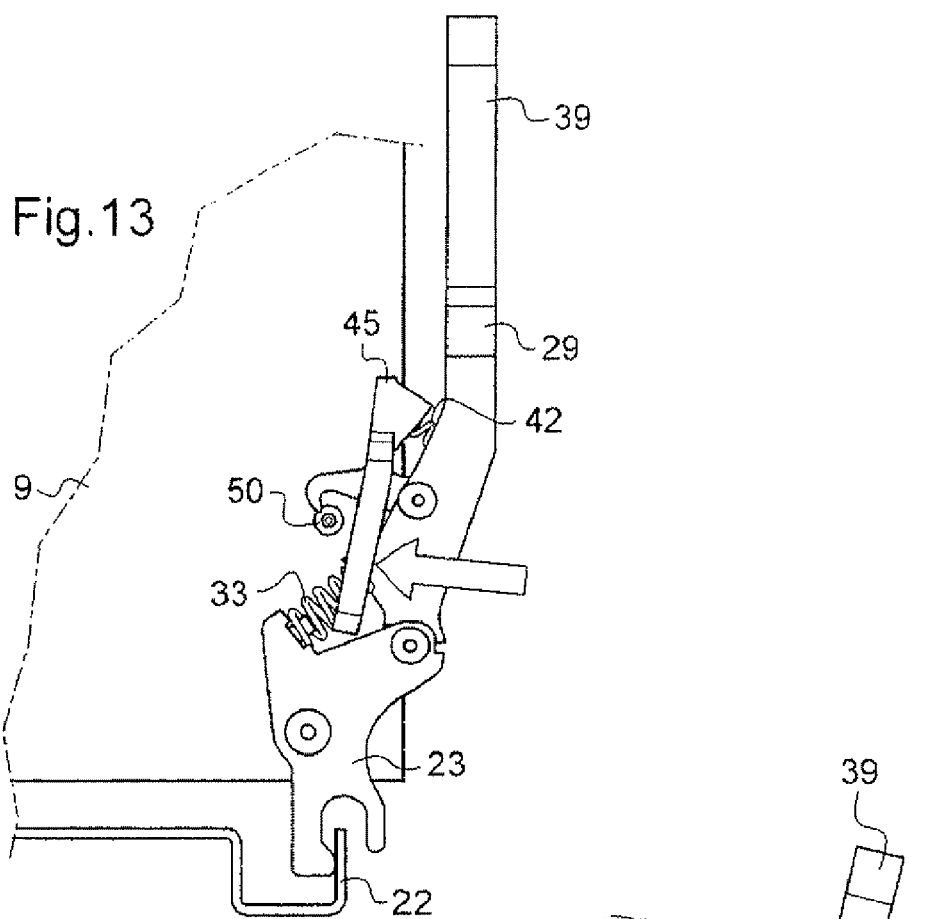
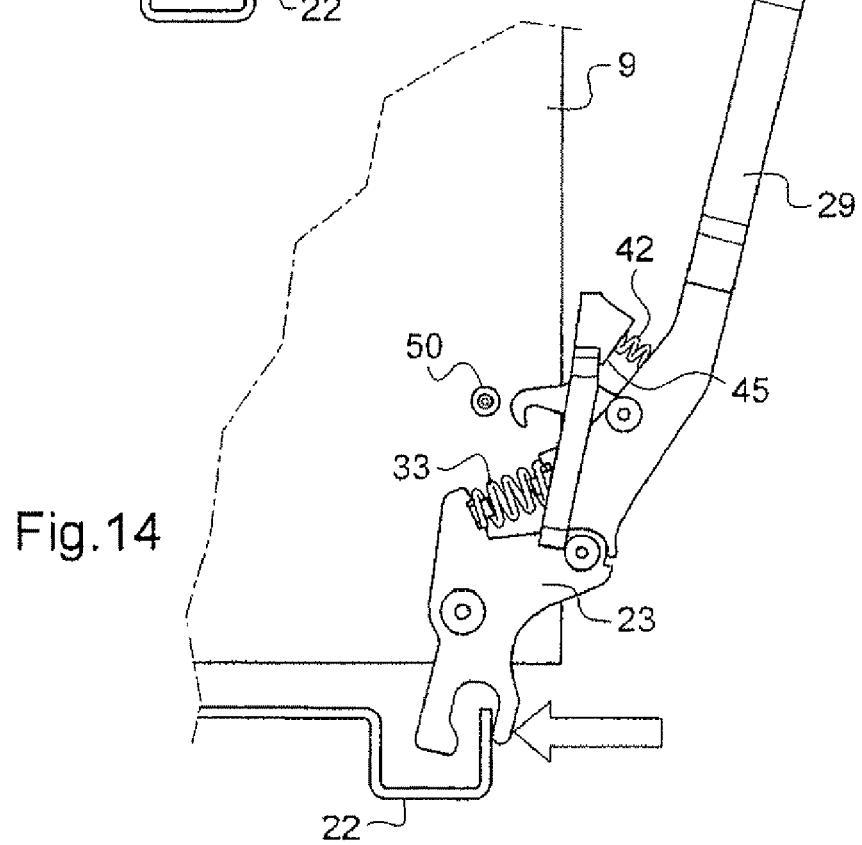

LOCKING ASSEMBLY FOR LOCKING AN ELECTRONICS CARD TO A RACK

FIELD OF THE INVENTION

The present invention relates to a system for positioning and locking an electronics card in a rack.

The invention applies more particularly to positioning and locking electronics cards in a rack in the field of aviation, in particular for avionics racks and bays.

BACKGROUND OF THE INVENTION

It is known to use daughter electronics cards that are connected at one of their ends to one or more motherboards and/or to isolated connectors that are connected to cabling.

The backplane connections of a rack may for example be made up of one or more connectors, and the positioning and locking of the connection between daughter cards and rack backplane connectors may be performed in various ways.

The rack backplane connector(s) may be fastened rigidly to the rack or may be floatingly mounted transversely and/or axially in order to accommodate positioning defects.

In another known variant, the connectors are mounted floatingly in the axial direction by a resilient element that compensates for differences in depth between rack backplane connectors.

In another known variant, transverse guidance is provided by the connector itself, in the form of grooves and projections that slide in one another.

Transverse guidance may also be provided independently of the connectors, with the help of metal centering fingers.

Cards may also be locked to the rack via the rack backplane connector, by means of clips, resilient pins, screws, or levers.

In a variant, card locking may be offset from the electronics card and the structure of the rack, e.g. with locking levers that are installed directly on the printed circuit of the electronics card or locking screws that, in a variant, are incorporated in the chassis that supports said printed circuit.

Known solutions for floatingly mounted rack backplane connectors generally present the defect of the connector not touching the rack back plates, thereby giving rise to gaps that encourage leakage of electromagnetic interference.

Furthermore, a locking system for locking the daughter electronics card to the rack that is incorporated in a rack backplane connector may present the drawbacks of being difficult to access for disconnection, of not providing clear visibility of a good connection, of not coping with problems of coupling depth when a plurality of connectors are mounted on the same electronics card, or indeed of not enabling the electronics card as a whole to be stiffened, which can give rise to problems with respect to the vibration performance of the electronics card in severe-environment applications, and of not enabling the rack backplane connectors and the electronics card to be mounted in any order.

Furthermore, it is known to use so-called "external" techniques for locking the electronics card to the rack, which techniques consist in combining longitudinal locking by screw fastening and transverse locking by means of a prismatic slideway, e.g. of the Calmark® type.

Locking merely by screw fastening does not make it possible to take up longitudinal clearances directly in the event of the rack having multiple connectors, and it does not make it simple to control the coupling force applied to the connectors. These two drawbacks then need to be mitigated by the connectors at the rack backplane. Furthermore, prismatic slideway systems do not make it possible to overcome continuous coupling forces.

To remedy those drawbacks, proposals have been made firstly to provide a connection that is floating along the connection axis over a plurality of connectors situated at the rack backplane, with this floating connection being provided by a resilient element such as a spring washer or a helical spring.

Nevertheless, such a floating connection system can require resilient elements that are very stiff, with having movement strokes of the order of several millimeters. Springs that satisfy such conditions are relatively bulky compared with the dimensions of connectors.

Furthermore, incorporating resilient elements in rack backplane connectors can make them more complex, giving rise to an increase in the sizes of the plates of connectors in order to house the resilient elements and the spring-retaining system.

Finally, a floating mount for connectors in a rack can lead to the connectors not pressing against the metal plate at the back of the rack, thereby leaving openings that lead to leakage of electromagnetic interference (EMI).

Furthermore, proposals have also been made to lock an electronics card to a rack by using systems of levers positioned on the electronics card, enabling the electronics card to be inserted in the rack.

Nevertheless, such locking systems do not provide permanent compensation for forces tending towards disconnection, which forces are generated by sealing systems, and those locking systems are unsuitable for compensating longitudinal clearances that are too great.

There exists a need to satisfy to the above-mentioned drawbacks in full or in part.

OBJECT AND BRIEF SUMMARY OF THE INVENTION

Exemplary embodiments of the invention provide a locking assembly for locking at least one electronics card to a rack, the assembly comprising:
  at least one electronics card;
  a rack; and
  a locking system for locking the card on the rack,
  the locking system including at least one resilient prestress element for prestressing the electronics card when it is fastened to the rack.

The or each resilient prestress element may be carried by the rack.

The rack may include a bottom plate having a housing and the locking system may comprise at least one carriage extending along a longitudinal axis and movable in the housing, the resilient prestress element being received in the carriage.

Other exemplary embodiments of the invention provide a locking assembly for locking at least one electronics card to a rack, the assembly comprising:
  at least one electronics card;
  a rack; and
  a locking system for locking the card on the rack,
  the locking system including at least one resilient prestress element for prestressing the electronics card when it is fastened to the rack, the or each resilient prestress element being carried by the rack, and the rack including a bottom plate having at least one housing and the locking system may comprise at least one carriage extending along a longitudinal axis and movable in the housing, the resilient prestress element being received in the carriage.

The invention makes it possible, amongst other things, to compensate the continuous forces that act between the electronics card and the rack.

The resilient prestress element is advantageously received in a housing formed in the carriage, and said housing advantageously includes portions in relief defining front and rear abutments for compressing the resilient prestress element in the carriage, such portions in relief make it possible for example to control the compression of the resilient prestress element in the carriage.

The resilient prestress element may be positioned in part or entirely inside the carriage, being for instance different from a spring connecting the electronics card and the carriage, such a spring lying outside the carriage.

Advantageously, the carriage includes a locking zone for the electronics card.

Advantageously, the electronics card comprises:
a printed circuit;
a structural part fastened to the printed circuit; and
at least one locking member for locking the card to the locking zone of the carriage, the locking member being carried by the structural part.

In a variant, the electronics card does not have a structural part and the locking member is carried directly by the printed circuit, without any intermediate structural part.

With a locking system of these exemplary embodiments of the invention, the card may be locked to the rack with or without the help of a standard tool such as a torque wrench.

The locking member may also be configured to enable the coupling force delivered by an operator to be multiplied and to avoid the electronics card returning rearwards under the effect of the forces that are exerted continuously and that oppose locking, such as the forces exerted by interface mats.

The locking zone advantageously includes tapping opening to the outside of the carriage, the structural part advantageously includes a face for bearing against the carriage when the electronics card is locked to the rack, said face including tapping, and the locking member advantageously comprises a screw designed to be received in the tapping in said face and in the locking zone of the carriage.

By way of example, the screw is a captive screw received in the tapping in the structural part, and the electronics card is locked to the rack by clamping the screw in the tapping of the carriage. The invention thus enables the card to be locked and unlocked to or from the rack depending on whether the captive screw is tightened or loosened.

In a variant, the locking zone advantageously includes at least one roller, e.g. mounted to rotate freely, extending transversely relative to the longitudinal axis of the carriage, and the locking member advantageously comprises a lever pivotally mounted on the structural part.

By way of example, the carriage has two freely-rotatable rollers: a front roller and a rear roller.

By way of example, the rear roller serves as a bearing point for inserting the electronics card while it is being locked to the rack, and the front roller serves for example as a bearing point while the electronics card is being unlocked, thereby facilitating ejection of the card from the rack.

The roller(s) may also serve to guide the movement in translation of the carriage in the housing provided in the bottom plate of the rack.

Advantageously, the lever comprises:
a proximal portion for bearing against the roller(s) during operations of locking and unlocking the electronics card to or from the rack; and
a distal portion defining a grip portion for a user.

The distal portion of the lever advantageously acts as a lever arm, thereby enabling the force exerted by the user to be increased.

The structural part and the distal portion are advantageously configured to keep the lever on the structural part in a predefined angular position. By way of example, this predefined position corresponds to the position of the lever when the electronics card is locked to the rack, thus making it possible to avoid the electronics card being unlocked in untimely manner.

The rack may also include a top plate having a housing for a carriage receiving a second resilient prestress element, similar to that described above for the bottom plate of the rack.

In other exemplary embodiments, the resilient prestress element of the locking system is carried by the electronics card.

Advantageously, the electronics card comprises a printed circuit and may optionally include a structural portion fastened to the printed circuit.

The bottom plate of the rack advantageously includes a groove defining a locking zone, and the electronics card includes a locking member advantageously comprising a lever hinged relative to the electronics card and configured to lock the electronics card to the groove in the bottom plate of the rack.

The locking lever is advantageously pivotally hinged to the electronics card.

Advantageously the locking lever includes a first finger that bears against one side of the groove in the rack during locking of the electronics card to the locking zone of the rack, and a second finger that bears against said side of the groove while unlocking the electronics card.

By way of example, the first finger enables the electronics card to be pushed in a first direction towards the back of the rack when the electronics card is being locked, whereas the second finger bears in a second direction, opposite to the first direction while the electronics card is being unlocked.

The two fingers of the locking lever may extend along parallel directions. These two levers may be facing opposite faces of the side when the electronics card is locked to the locking zone of the rack.

Advantageously, the locking member includes a grip handle hinged to the locking lever.

Advantageously, the grip handle is connected to the lever via a pivot connection. By way of example, the grip handle offers a zone of a size that is compatible with being gripped in the hand, enabling a user to handle the locking system easily. The grip handle is advantageously connected to the lever via a resilient prestress element of the locking system.

The lever and the grip handle are thus advantageously connected together by a hinge providing limited angular movement, thus making it possible to ensure proper operation of the locking system.

The grip handle and/or the lever advantageously include(s) retaining and centering means for retaining and centering the resilient prestress element, which means may make it possible to obtain a lever arm effect between the force exerted by the resilient element and the force exerted by one of the fingers of the lever on the rack.

Also advantageously, the locking member includes a blocking hook hinged to the grip handle.

The blocking hook is advantageously connected by a pivot connection to the grip handle.

The blocking hook is advantageously also connected to the grip handle via another resilient prestress element of the locking system.

The hinge obtained between the blocking hook and the grip handle may for example be a hinge capable of limited angular movement.

The grip handle and the blocking hook advantageously include retaining and centering means for retaining and centering the resilient prestress element connecting them together.

By way of example, the blocking hook includes a zone compatible with being gripped in the hand, making it easy for a user to handle.

The electronics card advantageously includes a hooking peg and the blocking hook is advantageously configured to hook onto the hooking peg.

Advantageously, the rack includes a top plate having a groove defining a center locking zone, and the electronics card includes a second locking member, similar to the above-described locking zone of the bottom plate of the rack and to the locking member of the electronics card.

Advantageously, the resilient prestress element(s) is/are dimensioned to overcome the coupling forces associated with the sealing elements of the locking assembly.

Other exemplary embodiments of the invention provide a metal rack back plate, configured to receive at least one electronics card, said plate being in particular part of an assembly that further comprises the above-described locking assembly, the plate comprising:
- a rear face including a plurality of cavities, each configured to receive a rack backplane connector and having a bearing plane against which the rack backplane connectors can bear; and
- a front face having a plurality of cavities, each configured to receive an electronics card connector and including a bearing plane against which the electronics card connectors can bear.

Such a plate enables the connectors to be centered in common, e.g. making it possible to position the rack back plate connectors accurately relative to one another, in particular when a plurality of rack back plate connectors are installed for a given electronics card.

By way of example, these exemplary embodiments of the invention make it possible to avoid using rack back plate connectors that are fitted with transverse and axial floating-mount systems, thereby avoiding the above-mentioned drawbacks.

A plate of these exemplary embodiments of the invention also make it possible to position the connectors of the card and the connectors of the rack back plate independently of the order with which they are assembled in the rack.

Advantageously, the plate includes keying means on its front and/or rear faces for inserting the connectors in the cavities.

These keying means may be pegs or coding keys, and incorporating connectors with the rack back plate may also facilitate mounting of the card connectors and of the rack back plate connectors in any order.

BRIEF DESCRIPTION OF THE DRAWINGS

Other advantages and advantageous characteristics appear on reading the following description of non-limiting embodiments of the invention and on examining the accompanying drawings, in which:

FIGS. 1 to 7 show a locking assembly in first embodiments of the invention;

FIGS. 8 to 14 show a locking assembly in second embodiments of the invention;

MORE DETAILED DESCRIPTION

First embodiments of a locking assembly are described with reference to FIGS. 1 to 7.

This assembly comprises a rack given overall reference 1 and an electronics card given overall reference 8.

Figure 1:
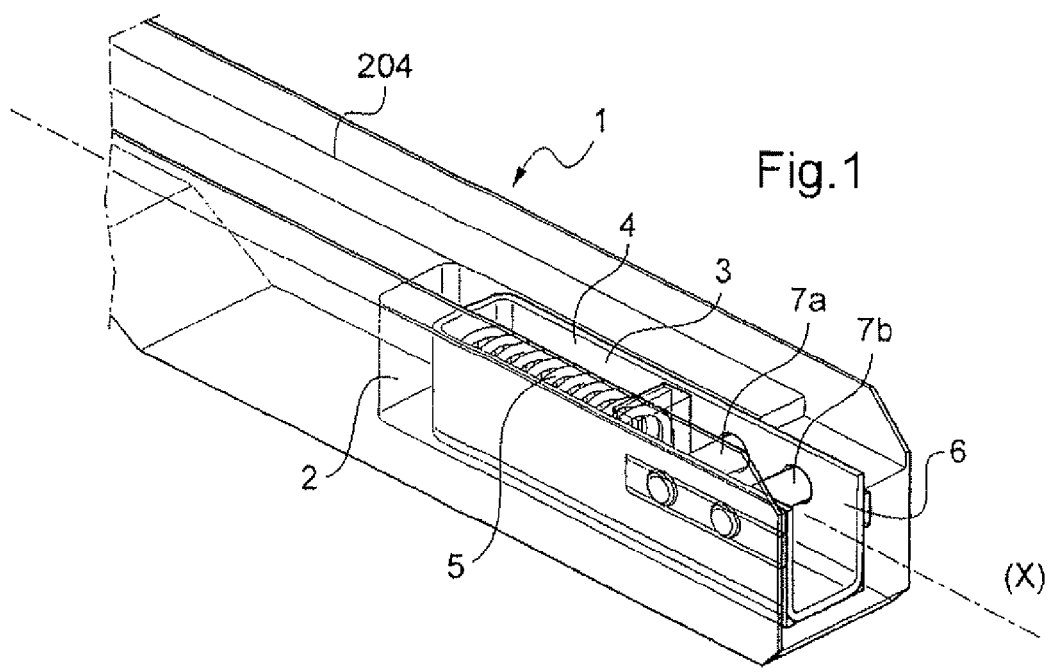
Figure 17:
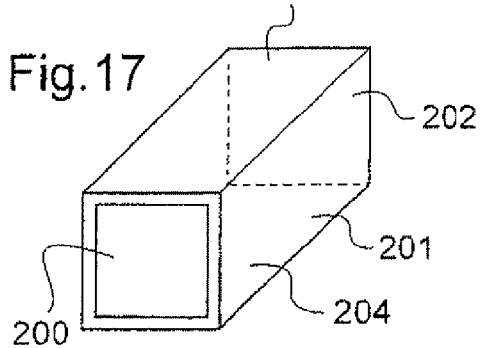
FIG. 17 is a diagrammatic view of a rack.

FIG. 17 is a diagram of a conventional rack 1. That rack comprises an open front face 200, side cheeks 201, a back plate 202, a top plate 203, and a bottom plate 204. As shown in FIG. 1, a housing 2 is formed inside the bottom plate 204 of the rack 1. A carriage 3 extending along a longitudinal axis X is received in the housing 2 so as to be movable in the housing along the axis X. By way of example, the carriage 3 is made of plastics material or of metal, e.g. being obtained by molding, machining, or cutting and folding.

In the example described the housing 2 is formed in the bottom plate of the rack close to the entry zone for an electronics card into the rack 1, however the invention is not limited to such an example.

The carriage 3 has a front portion 4 defining a housing within which there is received a resilient prestress element 5 that is constituted by a helical spring in the example described.

The invention is not limited to such a resilient prestress element. In variants that are not shown, the resilient prestress element may be made using a traction spring, a torsion spring, a spring blade, or indeed a spring washer.

Figure 5:
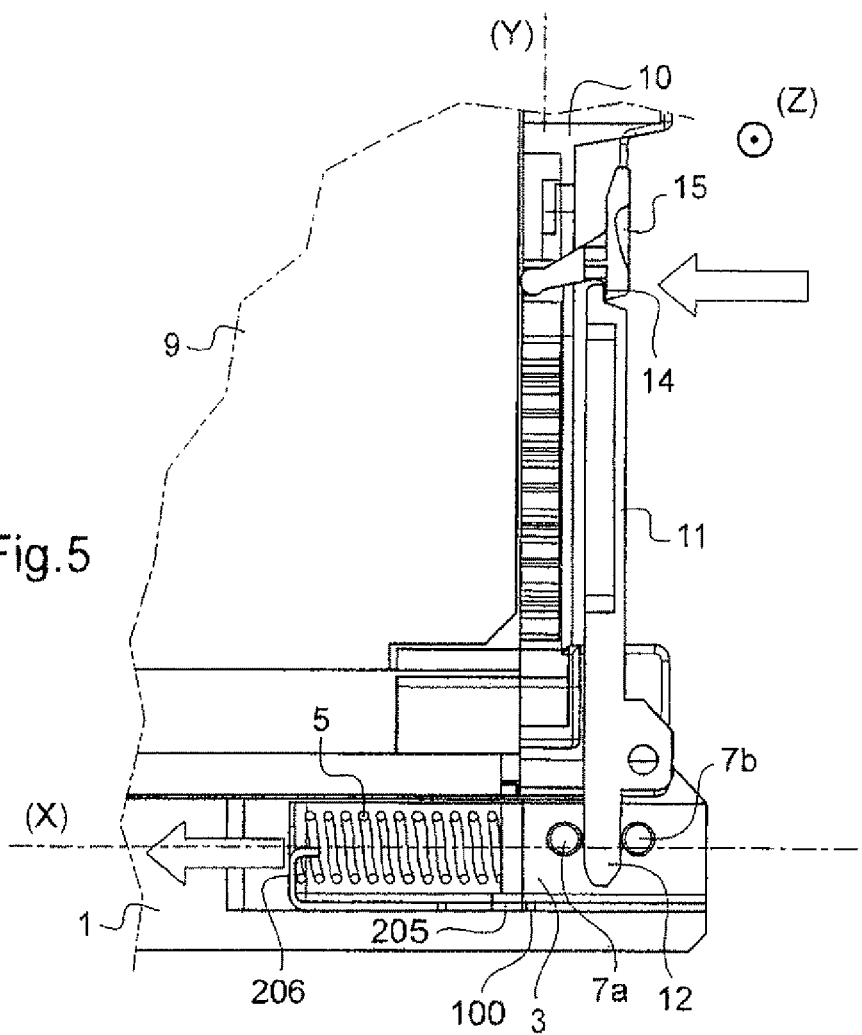

The movement of the carriage 3 inside the housing 2 along the axis X in the example described is limited towards the front by an abutment 205 formed on the bottom plate of the rack and visible in FIGS. 4 and 5, and towards the rear by compressing the resilient prestress element 5.

In addition, a portion in relief 206 is formed in the carriage 3 so as to constitute a front abutment for compressing the resilient prestress element 5 in the carriage 3. The wall of the carriage 3 also has an opening 100 that is visible in FIGS. 3 to 5 and that passes an element secured to the rack 1 and serving to constitute a rear abutment for compression of the resilient prestress element 5.

The carriage 3 in the example of FIGS. 1 to 7 also includes a rear portion 6 defining a locking zone.

The locking zone 6 in the example described includes a front roller 7a and a rear roller 7b that are potentially free to rotate and that extend perpendicularly relative to the axis X of the carriage.

Figure 2:
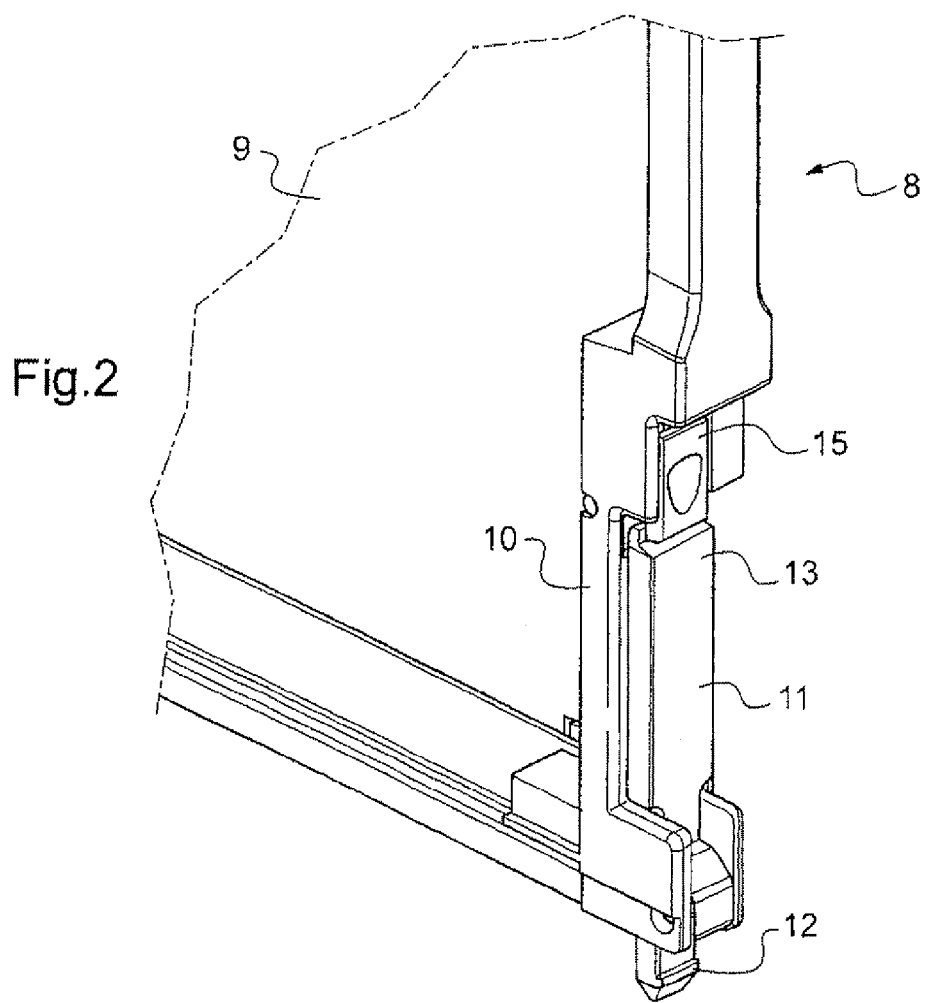

With reference to FIG. 2, there follows a description of an example electronics card 8 for locking in the rack 1 shown in FIG. 1.

The electronics card 8 includes for example a printed circuit 9 and, in the example described, a structural part 10, also referred to as a stiffener, that is fastened to the printed circuit and that carries a locking member 11 and that extends along a longitudinal axis Y.

In another example that is shown, the locking member 11 is fastened directly to the printed circuit 9.

In the example of FIGS. 1 to 5, the locking member 11 comprises a lever that is free to pivot relative to the structural part 10.

The lever includes a proximal portion 12 that may be in the shape of a hook, and a distal portion 13 defining a portion for gripping by an operator.

As shown in FIG. 3, the distal portion 13 includes a tongue 14 at its end.

In the example described, the structural part 10 also includes a button 15 suitable for sliding along the axis Y of the structural part 10 or for pivoting about an axis Z perpendicular to the plane of FIG. 5. For proper operation of the button 15, it is possible to provide a resilient return force.

In the example shown in FIG. 2, the lever is held against the structural part 10, with this position corresponding to the position occupied by the lever when the electronics card 8 is locked in the rack 1.

While the electronics card 8 is being locked in the rack 1, the proximal portion 12 of the lever 11 comes to bear against the rear roller 7b, exerting a force F thereon while an operator is exerting a force F' so as to bring the lever 11 into its locking position as shown in FIG. 5, in which position the lever rests between the rollers 7a and 7b of the carriage 3.

During this movement of the lever 11, the resilient prestress element 5 is put under tension, thereby causing the carriage 3 to move to the right in FIG. 4, as represented by arrow F".

As can be seen in FIG. 5, the lever is blocked against the structural part 10 by co-operation between the tongue 14 and the button 15.

When an operator desires to unlock the electronics card 8 from the rack 1, the operator may press against the button 15, thereby releasing the tongue 14 and consequently releasing the lever 11.

The operator may then exert a force on the distal portion 13 of the lever while the proximal portion 12 slides over the front roller 7a, thereby enabling the electronics card 8 to be extracted fully or in part from the rack 1.

The invention is not limited to the above-described example of the locking zone and the looking member.

Figure 6:
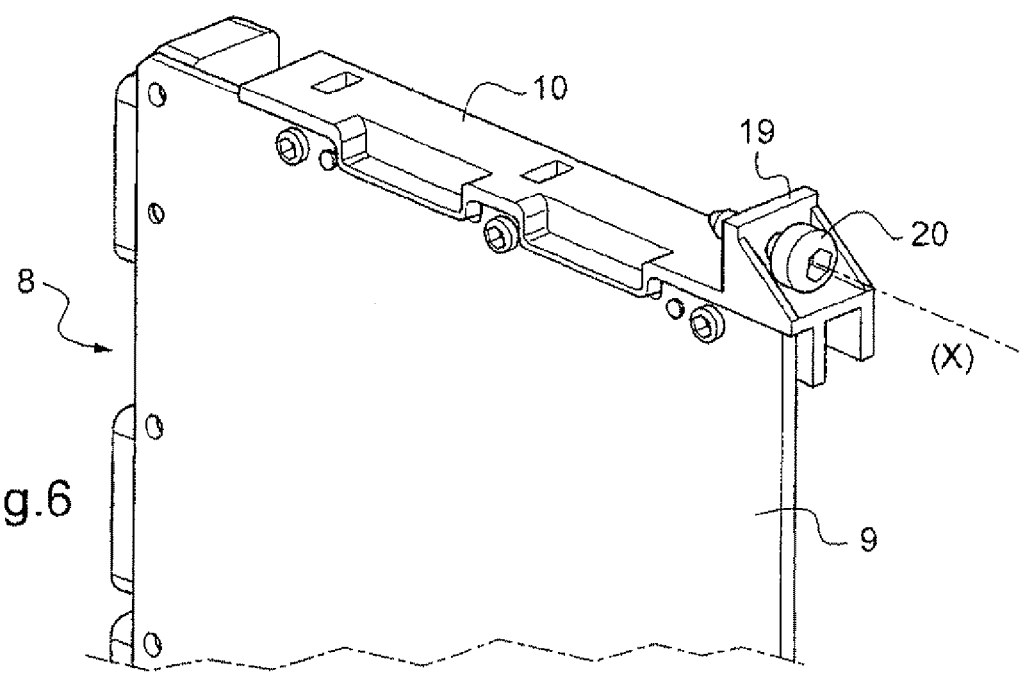

In the example of FIG. 6, the locking zone includes tapping 18 that is shown in FIG. 7, and the structural part 10 includes a projecting portion 19, e.g. extending perpendicularly to the longitudinal axis of the structural part 10, which in this example is parallel to the axis X of the carriage 3.

By way of example, the projecting portion 19 includes tapping within which there is screwed a captive screw 20 that constitutes a locking member. By way of example, the screw 20 is made captive by a smooth portion formed next to the head of the screw and presenting a diameter that is smaller than the diameter of the tapping in the projecting portion 19.

While the electronics card 8 is being locked in the rack 1, the captive screw 20 is screwed into the tapping 18 of the carriage 3 and the projecting face 19 comes to bear against the movable carriage 3.

While the connectors of the card are being coupled with the backplane connectors, i.e. connectors coming for example from the outside, the force needed for this coupling is developed by the resilient prestress element 5 of the carriage 3.

In order to unlock the electronics card 8 from the rack 1, the user may unscrew the captive screw.

In a variant that is not shown, the screw is held captive in the part 19 by other means and it serves to assist in extracting the card.

In another example that is not shown, the top plate 203 of the rack 1 also includes a housing 2 for a carriage 3 receiving a resilient prestress element 5 similar to the above description with reference to the bottom plate, so as to co-operate with a second locking member of the electronics card 8, similar to that described above.

With reference to FIGS. 8 to 14, there follows a description of a locking assembly constituting another embodiment.

In the example of FIG. 8, the electronics card 8 is configured to be locked by co-operation between a locking member carried by the electronics card 8 and a groove 22 formed in the bottom plate 204 of the rack 1 and defining a locking zone.

In the example described, the electronics card comprises a printed circuit 9.

By way of example, the locking member comprises a lever 23 pivotally mounted on the electronics card 8 by means of a screw 24.

In the example described, the lever 23 is mounted directly on the printed circuit 9, but in a variant that is not shown, the electronics card 8 includes a structural part, e.g. similar to that described with reference to FIGS. 1 to 7, and the lever 23 is fastened to the printed circuit 9 via said structural part.

In the example shown, the lever 23 has two fingers 25 and 26 for coming into contact with the groove 22. In the example described, the finger 25 presents a curved end 27.

Still in the example described, the locking member includes a grip handle 29 that is hinged to the lever 23 via two connections.

The lever 23 and the grip handle 29 are connected together firstly by a pivot connection via a screw 30 and secondly via a resilient prestress element 33 that, in the example described, is constituted by a helical spring, but that could equally well be constituted, in other exemplary embodiments, by a traction spring, a torsion spring, a spring blade, or indeed a spring washer.

The two connections between the grip handle 29 and the lever 23 make it possible to obtain a hinge between these two elements that provide limited angular movement.

At its end opposite to the fingers 25 and 26, the lever 23 has a zone 35 including bearing and centering means for the resilient prestress element 33.

The grip handle also includes a bearing zone 37 for the resilient prestress element 33, serving to guide said resilient prestress element 33 and to keep it in position.

By way of example, the zones 35 and 37 are obtained by cylindrical setbacks, each holding one end of the spring captive. The grip handle 29 may also have a grip zone 39, compatible with being gripped in the hand of a user.

The locking member shown in FIG. 8 also has a blocking hook 40 hinged on the grip handle 29.

The hook 40 is connected firstly to the grip handle 29 via a pivot connection on a screw 41, and secondly via a second resilient prestress element 42.

These two connections make it possible to obtain a hinge between the blocking hook 40 and the grip handle 29 that presents limited angular movement.

The blocking hook 40 may include a portion 44 of curved shape for performing a function that is described below.

The hook 40 also has a zone 45 defining a grip portion for gripping by a user.

In the example shown, the electronics card 8 has a hooking peg 50. As described, the hooking peg 50 may be fastened directly to the printed circuit 9, or in a variant it may be incorporated in a structural part fastened to the printed circuit 9.

There follows a description of an example of locking an electronics card 8 in a rack 1 using the locking system described with reference to FIGS. 8 to 14.

While an electronics card 8 is being engaged in the groove 22 of the rack 1, the operator pushes against the grip handle 29, as shown in FIG. 10.

This force is transmitted via the resilient prestress element 33 to the lever 23 and causes the lever to pivot relative to the card 8 about the axis defined by the screw 24. As a result of the lever 23 pivoting, the finger 25 engages in the groove 22 and exerts a force on the edge of said groove causing the electronics card 8 to advance towards the back of the rack.

As the lever 23 pivots, the blocking hook 40 engages and then moves around the hooking peg 50, as shown in FIG. 11, after which it hooks onto the hooking peg by means of its curved portion 44, as shown in FIG. 12.

In the position shown in FIG. 12, the grip handle 29 can no longer return rearwards relative to the electronics card 8. By reaction, the resilient prestress element 33 exerts a force on the locking lever 23, with this force then being transferred to the rack 1 via the finger 25. A continuous force is then exerted urging the electronics card 8 towards the back of the rack, so as to ensure that the connectors are continuously under pressure.

During an unlocking operation, the user exerts pressure on the bearing zone 45 of the blocking hook 40, thereby releasing the blocking hook 40 from the hooking peg 50. As a result of the action of the resilient prestress element 42, the grip lever 29 pivots rearwards. The user can then take hold of the grip lever and, by pulling it, can extract the electronics card 8 from the rack 1, with this extraction being facilitated, for example, by the force exerted by the finger 26 of the locking lever 23 on the edge of the groove 22, thus pushing the electronics card 8 rearwards, as shown in FIG. 14.

The invention is not limited to the embodiment described above.

In a variant, a locking zone similar to that formed on the bottom plate 204 is formed on the top plate 203 of the rack to co-operate with a second locking member carried by the electronics card 8 and similar to that co-operating with the locking zone 22 of the bottom plate 204 as described with reference to FIGS. 8 to 14.

Figure 15:
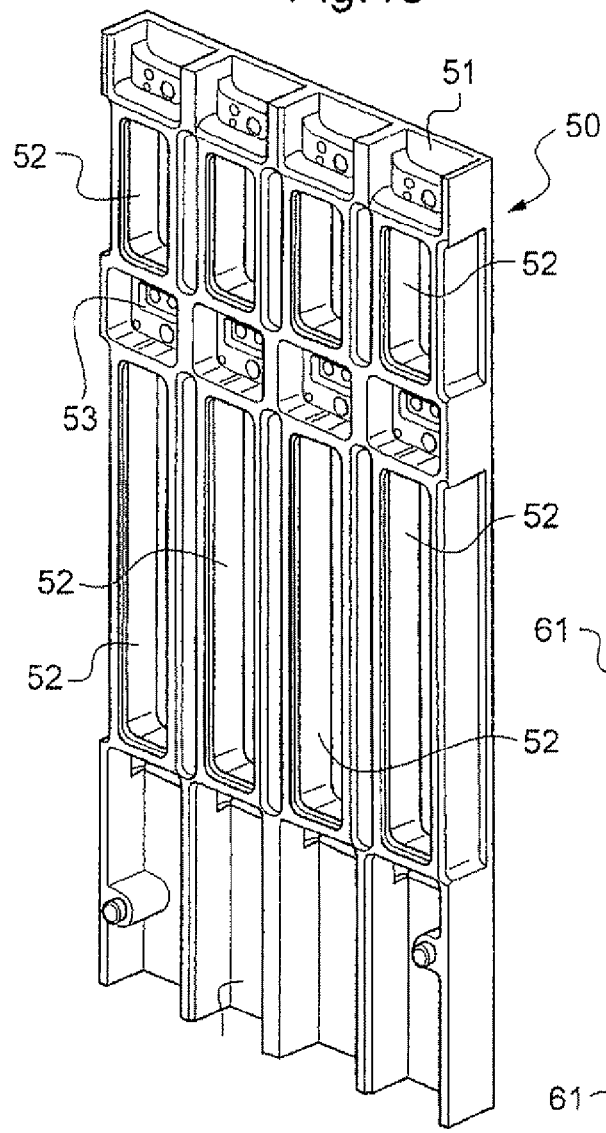
FIGS. 15 and 16 show a rack back plate in another embodiment of the invention.
Figure 16:
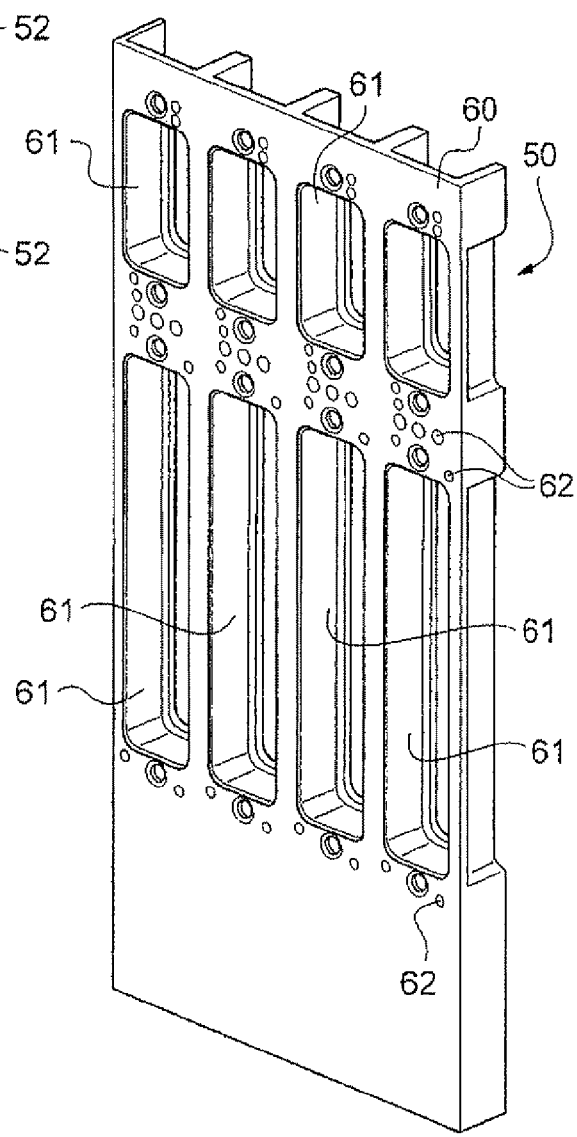

With reference to FIGS. 15 and 16, there follows a description of an example rack back plate 202 of exemplary embodiments of the invention.

This plate has a front face 51 shown in FIG. 15.

The front face 51 in the example described has a plurality of hollow cavities 52 serving to center the cavities of card connectors in the transverse direction.

By way of example, the front face has two rows of cavities, each row of cavities presenting the same size.

The front face 51 also has keying zones 53, e.g. constituted by pegs or by code keys.

In the example described, the front face 51 also has a fastening zone 54 for fastening to a motherboard.

By way of example, the front face 51 defines a bearing plane in the axial direction enabling the connectors of the card to be pressed against said bearing plane in order to close the cavities 52 of the plate, thus making it possible to combat electromagnetic interference leaks.

With reference to FIG. 16, there follows a description of an example of a rear face 60 for a metal rack back plate of the invention.

In the example described, a plurality of cavities 61 are formed in the rear face 60 in order to recenter the connectors wired to the rack back plate transversely. The recentering is performed for example against the outside faces of one or more of the cavities of a wired connector.

By way of example, the cavities 61 are in the form of rows, with cavities forming parts of different rows having different sizes, for example.

The rear face 60 also has keying means 62 that are constituted by holds for receiving keying pegs in the example described.

Advantageously, the rear face 60 defines a bearing plane in the axial direction enabling the rack back plane connectors, once fastened, to be pressed against the plate and to close the cavities in the plate against electromagnetic interference leaks.

A plate and a locking assembly as described above advantageously make it possible to ensure satisfactory transverse centering between connectors, to take up axial clearances of connectors, to provide satisfactory shielding against electromagnetic interference, and to compensate the continuously-acting connection forces.

The invention is not limited to the examples described above.

In the claims, the term "comprising a" should be understood as "comprising at least one" unless specified to the contrary.

What is claimed is:

1. A locking assembly for locking at least one electronics card to a rack, the assembly comprising:
   at least one electronics card;
   a rack having a bottom plate with at least one housing; and
   a locking system for locking the card on the rack;
   the locking system comprising at least one carriage extending along a longitudinal axis and movable being guided in translation in the housing of the rack, and the locking system including at least one resilient prestress element for prestressing the electronics card when it is fastened to the rack, the resilient prestress element being received in the carriage.

2. The assembly according to claim 1, the resilient prestress element being received in a housing formed in the carriage, and said housing including portions in relief defining front and rear abutments for compressing the resilient prestress element in the carriage.

3. The assembly according to claim 1, the carriage including a locking zone for the electronics card.

4. The assembly according to claim 3, the electronics card comprising:
   a printed circuit;
   a structural part fastened to the printed circuit; and
   at least one locking member for locking the card to the locking zone of the carriage, the locking member being carried by the structural part.

5. The assembly according to claim 4, the locking zone including tapping opening to the outside of the carriage, the structural part including a face for bearing against the carriage when the electronics card is locked to the rack, said face including tapping, and the locking member comprising a screw configured to be received in the tapping in said face and in the locking zone.

6. The assembly according to claim 5, the locking zone comprising at least one roller extending transversely to the longitudinal axis of the carriage, and the locking member comprising a lever pivotally mounted on the structural part.

7. The assembly according to claim 6, the lever having a proximal portion for bearing against the roller when the electronics card is locked to the rack, and a distal portion defining a grip portion.

8. The assembly according to claim 7, the structural part and the distal portion being configured to hold the lever on the structural part in a predefined angular position.

9. An assembly, comprising a metal rack back plate for receiving at least one electronics card, the plate comprising:
   a rear face including a plurality of cavities, each configured to receive a rack backplane connector and having a bearing plane against which the rack backplane connectors can bear; and
   a front face having a plurality of cavities, each configured to receive an electronics card connector and including a bearing plane against which the electronics card connectors can bear;
   the assembly further including the locking assembly according to claim 1.

10. The assembly according to claim 9, the front and/or rear face of the plate including keying means for inserting connectors in the cavities.

* * * * *